United States Patent
Wu (12) 
(10) Patent No.: US 6,744,664 B1
(45) Date of Patent: Jun. 1, 2004

(54) DUAL-BIT FLOATING-GATE FLASH CELL STRUCTURE AND ITS CONTACTLESS FLASH MEMORY ARRAYS

(75) Inventor: Ching-Yuan Wu, Hsinchu (TW)

(73) Assignee: Silicon-Based Technology Corp., Hsinchu (TW)

( * ) Notice: Subject to any disclaimer, the term of this patent is extended or adjusted under 35 U.S.C. 154(b) by 9 days.

(21) Appl. No.: 10/356,187

(22) Filed: Jan. 30, 2003

(51) Int. Cl.$^7$ .............................................. G11C 16/04
(52) U.S. Cl. .............................. 365/185.03; 365/185.01
(58) Field of Search ..................... 365/185.03, 185.01; 257/314, 315

(56) References Cited

U.S. PATENT DOCUMENTS

| | | | | |
|---|---|---|---|---|
| 5,229,631 A | * | 7/1993 | Woo | 257/314 |
| 5,440,158 A | * | 8/1995 | Sung-Mu | 257/314 |
| 5,918,125 A | * | 6/1999 | Guo et al. | 438/264 |
| 6,344,993 B1 | * | 2/2002 | Harari et al. | 365/185.01 |

* cited by examiner

*Primary Examiner*—Anh Phung
(74) *Attorney, Agent, or Firm*—Pro-Techtor International Services (57) ABSTRACT

A dual-bit floating-gate flash cell structure comprises a gate region being formed between a common-source region and a common-drain region. The gate region comprises a pair of floating-gates being defined by a pair of second sidewall dielectric spacers and a select-gate dielectric layer being formed between the pair of floating-gates. The common-source/drain region comprises a common-source/drain diffusion region or a pair of isolated source/drain diffusion regions being divided by a shallow trench isolation formed between a pair of first sidewall dielectric spacers. A word line being formed over an intergate dielectric layer is at least formed over the pair of floating-gates and the select-gate dielectric layer. Based on common-source/drain diffusion regions and isolated source/drain diffusion regions of the dual-bit floating-gate cell structure, two different contactless flash memory arrays are formed.

20 Claims, 11 Drawing Sheets

DUAL-BIT FLOATING-GATE FLASH CELL STRUCTURE AND ITS CONTACTLESS FLASH MEMORY ARRAYS

FIELD OF THE INVENTION

The present invention relates to a non-volatile semiconductor memory cell and its memory array and, more particularly, to a dual-bit floating-gate flash cell structure and its contactless flash memory arrays.

DESCRIPTION OF THE RELATED ART

A stack-gate flash memory cell is known to be a one-transistor cell, in which a gate length of the cell can be defined by using a minimum feature size (F) of technology used. As a consequence, the stack-gate flash memory cell is often used in a high-density flash memory system. The stack-gate flash memory cell can be configured into different array architectures such as NAND, NOR, and AND, based on the basic logic function. For a NAND-type flash memory array, the stack-gate flash memory cells are connected in series through common source/drain diffusion regions. In general, a unit cell size of a NAND-type flash memory array is small, but the read speed is slow due to the series resistance of the configuration. For a NOR-type flash memory array, the read speed is faster, but the unit cell size is larger than that of a NAND-type flash memory array due to the bit-line contacts and the punch-through effect becomes a major concern for device scaling. For a AND-type flash memory array, the stack-gate flash memory cells are connected in parallel through the buried source/drain diffusion lines, the unit cell size is slightly larger than that of a NAND-type flash memory array and is smaller than that of a NOR-type flash memory array, and the read speed is faster than that of a NAND-type array and is slower than that of a NOR-type flash memory array. The stack-gate flash memory cells can be implemented to form a dual-bit flash memory cell by using a pair of stack-gate flash memory cells separated by a select-gate transistor to prevent the over-erase problem of the stack-gate structure. A typical example of a dual-bit flash memory cell is shown in FIG. 1A and FIG. 1B.

Figure 1A:
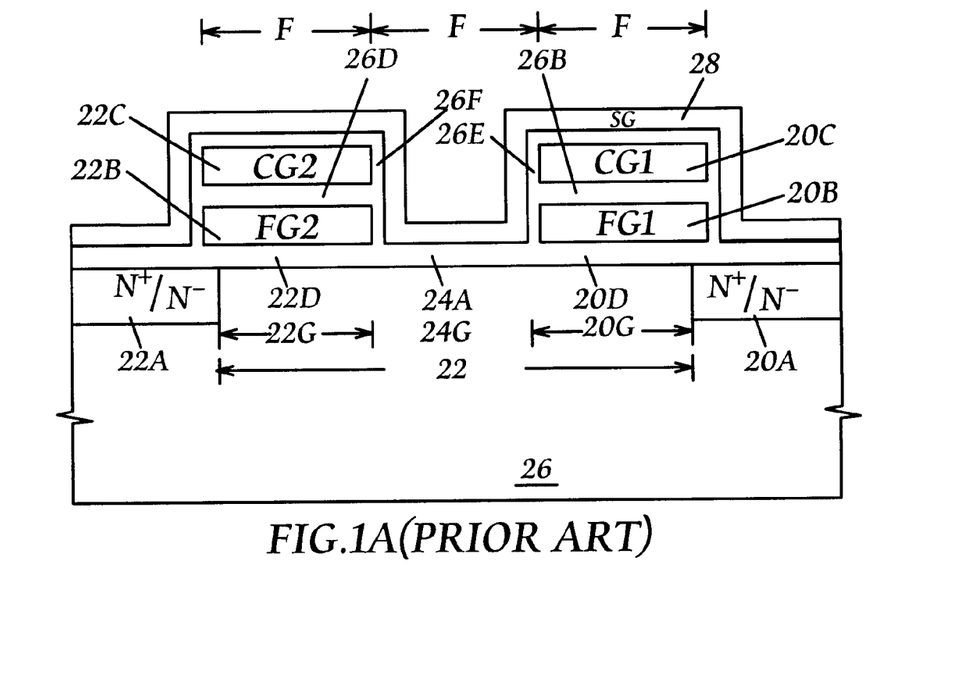
FIG. 1A shows a cross-sectional view of a dual-bit floating-gate flash memory cell and FIG. 1B shows a top plan view of the dual-bit floating-gate flash memory cell shown in FIG. 1A.
Figure 1B:
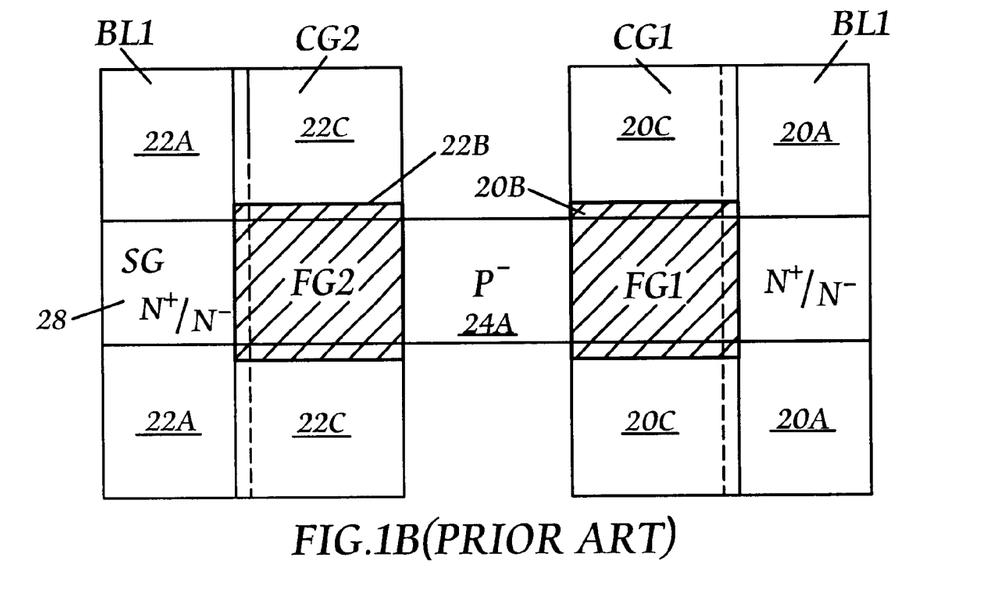

Referring now to FIG. 1A, two stack-gate cells 20G, 22G are separated by a select gate 24G and two common $N^+/N^-$ diffusion lines 20A, 22A being acted as bit lines are formed in each outer side portion of the two gate-stack cells 20G, 22G. A top plan view of FIG.1A is shown in FIG. 1B, in which a polysilicon layer 28 being acted as a select-gate line is formed above the two common $N^+/N^-$ diffusion lines 20A, 22A and the two control-gate lines 20C, 22C of the two stack-gate cells. From FIG. 1A and FIG. 1B, it is clearly seen that four masking photoresist steps are required to implement a dual-bit flash memory cell and the cell size of each bit is limited to $4F^2$. Moreover, there are several drawbacks as compared to existing stack-gate cell used in NAND, NOR and AND arrays: very high parasitic capacitances between the select-gate line 28 and the bit lines 20A, 22A; very high parasitic capacitances between the select-gate line 28 and the control-gate lines 20C, 22C of the stack-gate cells; alignment between the select gate line 28 and the floating-gates 22B, 20B is critical; isolation between the stack-gate cells in nearby select-gate lines is poor; and isolation between the select-gate lines in nearby control-gate lines is weak. It should be noted that poor isolation between nearby select-gate lines may result in erroneous data reading for a selected cell.

It is, therefore, an objective of the present invention to offer a dual-bit floating-gate cell structure having a cell size of each bit smaller than $4F^2$.

It is another objective of the present invention to provide good isolation for nearby dual-bit floating-gate cells under nearby word lines.

It is a further objective of the present invention to offer two array architectures for the dual-bit floating-gate cells with less masking photoresist steps.

SUMMARY OF THE INVENTION

The present invention discloses a dual-bit floating-gate flash cell structure and its contactless flash memory arrays being formed on a semiconductor substrate. The dual-bit floating-gate flash cell structure comprises a gate region being formed between a common-source region and a common drain region, wherein the gate region and the common-source/drain regions are patterned by a first masking photoresist step. The gate region comprises a pair of floating gates being formed on a pair of tunneling dielectric layers and defined by a pair of second sidewall dielectric spacers and a select-gate dielectric layer being formed between the pair of floating gates, wherein an implant region comprising a shallow implant region for threshold-voltage adjustment and a deep implant region for forming a punch-through stop is formed in a surface portion of the semiconductor substrate under the select-gate dielectric layer. The common source/drain region comprises a common-source/drain diffusion region or a pair of isolated source/drain diffusion regions; a pair of first sidewall dielectric spacers being formed over sidewalls of each of the common-source/drain regions and on a portion of the tunneling dielectric layer to form a shallow heavily-doped common-source/drain diffusion region within each of the common-source/drain diffusion regions or a shallow trench between the pair of first sidewall dielectric spacers for obtaining the pair of isolated source/drain diffusion regions; and an etched-back first planarized thick-oxide layer together with a pair of etched-back first sidewall dielectric spacers being formed in each of the common-source/drain regions. A word line over an intergate dielectric layer is formed over the pair of floating-gates and the select-gate dielectric layer in the gate region and the pair of etched-back first sidewall dielectric spacers and the etched-back first planarized thick-oxide layer in each of the common-source/drain regions, wherein the word line, the intergate dielectric layer and the pair of floating-gates are simultaneously patterned and etched by a second masking photoresist step and the semiconductor substrate in the gate region outside of the word line is implanted with doping impurities to form isolation implant regions or is anisotropically etched to form shallow trench isolation regions.

The dual-bit floating-gate cell structure as described is used to form two different contactless flash memory arrays: a contactless parallel common-source/drain diffusion bit-lines array and a contactless parallel isolated source/drain diffusion bit-lines array.

The contactless parallel common-source/drain diffusion bit-lines array comprises a plurality of gate regions being formed in parallel and alternately on a semiconductor substrate by using a first masking photoresist step, wherein each of the plurality of gate regions is located between common-source/drain regions; a common-source/drain diffusion region acted as a common-source/drain diffusion bit line being formed in a surface portion of the semiconductor substrate in each of the common-source/drain regions; a pair of etched-back first sidewall dielectric spacers being formed over a pair of tunneling dielectric layers in each of the common-source/drain regions; a shallow heavily-doped commonsource/drain diffusion region being formed by implanting doping impurities into a surface portion of the semiconductor substrate between a pair of first sidewall dielectric spacers in a self-aligned manner and within each of the common-source/drain diffusion regions; an etched-back first planarized thick-oxide layer being formed between the pair of etched-back first sidewall dielectric spacers in each of the common-source/drain regions; a plurality of paired floating-gates defined by a pair of second sidewall dielectric spacers being formed in each of the plurality of gate regions with a select-gate dielectric layer over an implant region being formed between the pair of floating gates; a plurality of word lines over a plurality of intergate dielectric layers being formed transversely to the common-source/drain regions and over the plurality of paired floating-gates and the select-gate dielectric layers in the plurality of gate regions and over a plurality of etched-back first sidewall dielectric spacers and the etched-back first planarized thick-oxide layers in the common-source/drain regions; and a plurality of isolation implant regions or a plurality of shallow trench isolation regions being formed in surface portions of the semiconductor substrate between the common-source/drain regions outside of the plurality of word lines. The implant region under the select-gate dielectric layer comprises a shallow implant region for threshold-voltage adjustment and a deep implant region for forming a punch-through stop.

The contactless parallel isolated source/drain diffusion bit-lines array comprises a plurality of gate regions being formed in parallel and alternately on a semiconductor substrate by using a first masking photoresist step, wherein each of the plurality of gate regions is located between common-source/drain regions; a pair of isolated source/drain diffusion regions defined by a pair of first sidewall dielectric spacers being separated by a shallow trench isolation region in each of the common-source drain regions; an etched-back first planarized thick-oxide layer being formed between a pair of etched-back first sidewall dielectric spacers in each of the common-source/drain regions; a plurality of paired floating-gates defined by a pair of second sidewall dielectric spacers being formed in each of the plurality of gate regions with a select-gate dielectric layer over an implant region being formed between the paired floating-gates; a plurality of word lines over a plurality of intergate dielectric layers being formed transversely to the isolated source/drain diffusion regions and over the plurality of paired floating-gates and the select-gate dielectric layers in the plurality of gate regions and a plurality of etched-back first sidewall dielectric spacers and the etched-back first planarized thick-oxide layers in the common-source/drain regions; and a plurality of isolation implant regions or a plurality of shallow trench isolation regions being formed in surface portions of the semiconductor substrate outside of the plurality of word lines and between the common-source/drain regions. The implant region under the select-gate dielectric layer comprises a shallow implant region for threshold-voltage adjustment and a deep implant region for forming a punch-through stop. dr

BRIEF DESCRIPTION OF THE DRAWINGS

FIG. 1A and FIG. 1B show schematic diagrams of the prior art, in which

DETAILED DESCRIPTION OF THE PREFERRED EMBODIMENTS

Referring now to FIG. 2A through FIG. 2I, there are shown the process steps and their cross-sectional views for forming a dual-bit floating-gate cell structure and its contactless parallel common-source/drain diffusion bit-lines array of the present invention.

Figure 2A:
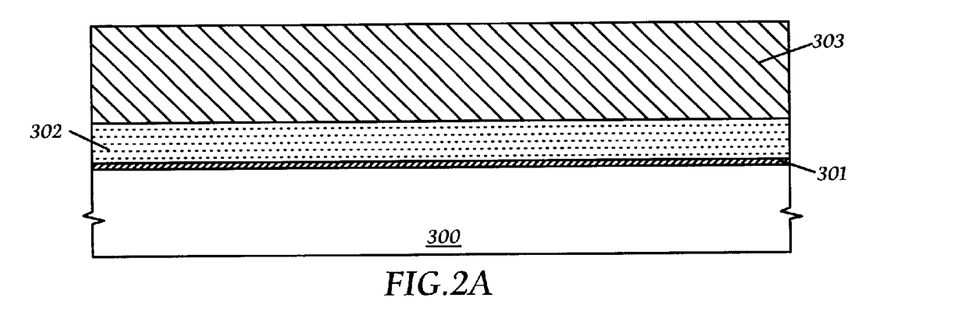
FIG. 2A through FIG. 2I show process steps and their cross-sectional views for forming a dual-bit floating-gate cell structure and its contactless parallel common-source/drain diffusion bit-lines array of the present invention.

FIG. 2A shows that a tunneling dielectric layer 301 is formed on a semiconductor substrate 300 of a first conductivity type; a first conductive layer 302 is formed on the tunneling dielectric layer 301; and a first masking dielectric layer 303 is formed on the first conductive layer 302. The tunneling dielectric layer 301 is preferably a thermal oxide layer or a nitrided thermal oxide layer and its thickness is preferably between 70 Angstroms and 120 Angstroms. The first conductive layer 302 is preferably a doped polycrystalline silicon layer or a doped amorphous silicon layer as deposited by low-pressure chemical vapor deposition (LPCVD) and its thickness is preferably between 1000 Angstroms and 3000 Angstroms. The first masking dielectric layer 303 is preferably a silicon nitride layer as deposited by LPCVD and its thickness is preferably between 2000 Angstroms and 5000 Angstroms.

Figure 2B:
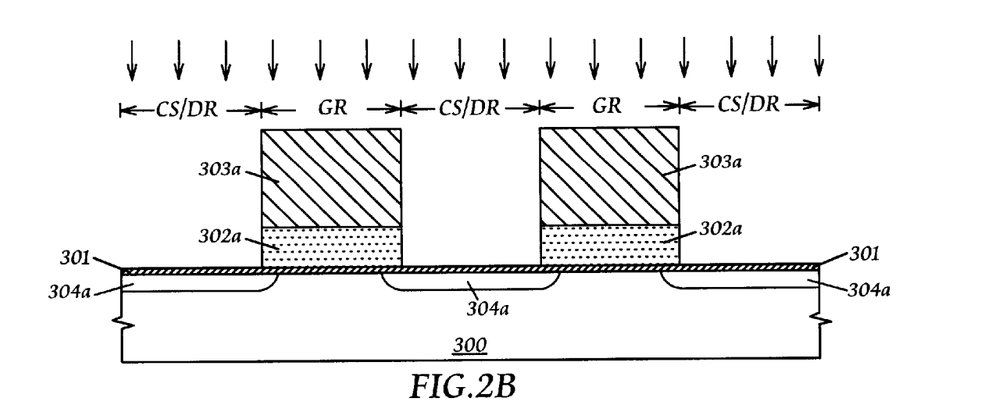

FIG. 2B shows that the first masking dielectric layer 303 is patterned by a first masking photoresist step using PR1 (not shown) to define a plurality of gate regions (GR) and a plurality of common-source/drain regions (CS/DR); the first masking dielectric layer 303 and the first conductive layer 302 in each of the plurality of common-source/drain regions (CS/DR) are sequentially removed by using anisotropic dry etching; an ion-implantation process is performed in a self-aligned manner to form a plurality of common-source/ drain diffusion regions 304a of a second conductivity type. It should be noted that the width of the gate region (GR) and the width of the common-source/drain region (CS/DR) can be defined to be equal to a minimum feature size (F) of technology used. The common-source/drain diffusion region 304a can be lightly-doped, moderately doped, or heavily-doped.

Figure 2C:
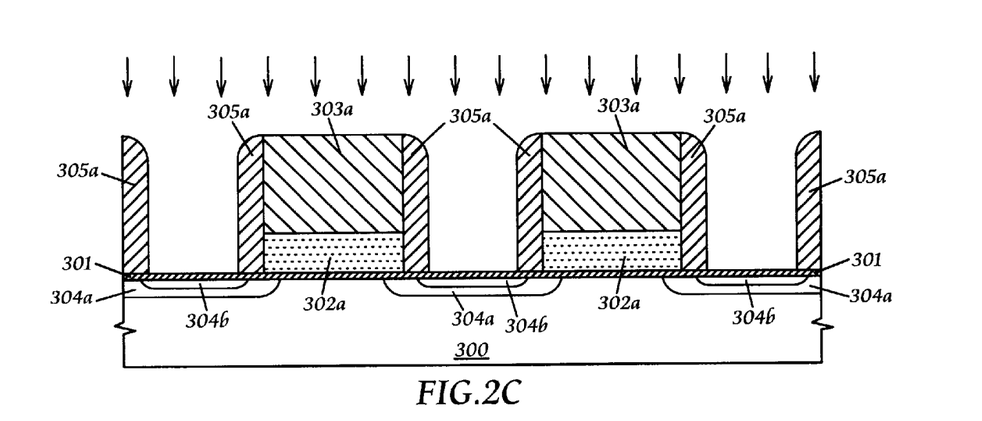

FIG. 2C shows that a pair of first sidewall dielectric spacers 305a are formed over sidewalls of nearby gate regions (GR) and on a portion of the tunneling dielectric layer 301 in each of the common-source/drain regions (CS/DR); an ion-implantation process is then performed in a self-aligned manner to form a shallow heavily-doped common-source/drain diffusion region 304b of the second conductivity type within each of the common-source/drain diffusion regions 304a. The pair of first sidewall dielectric spacers 305a are preferably made of silicon-dioxide and are formed by first depositing a silicon dioxide layer 305 using LPCVD and then etching back a thickness of the deposited silicon dioxide layer 305.

Figure 2D:
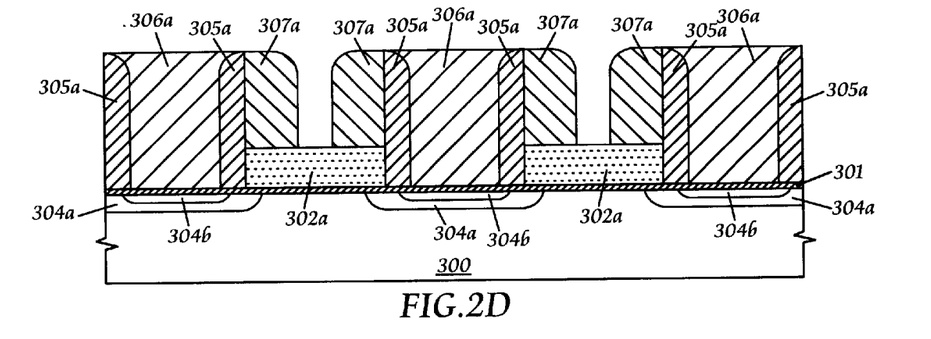

FIG. 2D shows that a first planarized thick-oxide layer 306a is formed over a gap between the pair of first sidewall dielectric spacers 305a in each of the common source/drain regions (CS/DR); the patterned first masking dielectric layer 303a in each of the gate regions (GR) is selectively removed by using hot phosphoric acid or anisotropic dry etching; and a pair of second sidewall dielectric spacers 307a are formed over sidewalls of nearby first sidewall dielectric spacers 305a and on a portion of the patterned first conductive layer 302a to define a pair of floating-gate layers 302b and a select-gate region (SGR) between the pair of floating-gate layers 302b in each of the gate regions (GR). The first planarized thick-oxide layer 306a is preferably made of silicon dioxide, P-glass, or BP-glass and is formed by first depositing a thick-oxide film 306 using LPCVD, high-density plasma (HDP) CVD, or plasma-enhanced (PE) CVD and then planarizing the deposited thick-oxide film 306 using chemical-mechanical polishing (CMP) with the patterned first masking dielectric layer 303a as a polishing stop. The pair of second sidewall dielectric spacers 307a are preferably made of silicon nitride as deposited by LPCVD. It is clearly seen that the select-gate region (SGR) in each of the gate regions (GR) can be easily controlled by the spacer width of the pair of second sidewall dielectric spacers 307a and the spacer width can be controlled by the thickness of the deposited dielectric layer 307. It should be noted that the pair of second sidewall dielectric spacers 307a can be made of silicon dioxide as deposited by LPCVD.

Figure 2E:
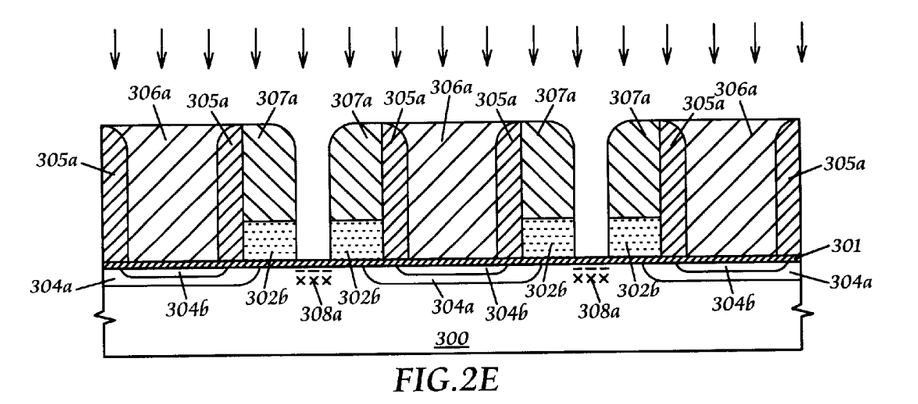

FIG. 2E shows that the patterned first conductive layers 302a between the pair of second sidewall dielectric spacers 307a are selectively removed by using anisotropic dry etching and an ion-implantation process is performed in a self-aligned manner by implanting doping impurities across the tunneling dielectric layer 301 into the semiconductor substrate 300 to form an implant region 308a of the first conductivity type in each of the select-gate regions (SGR). The implant region 308a may comprise a shallow implant region as indicated by a dash line for threshold-voltage adjustment and a deep implant region as indicated by cross symbols for forming a punch-through stop.

Figure 2F:
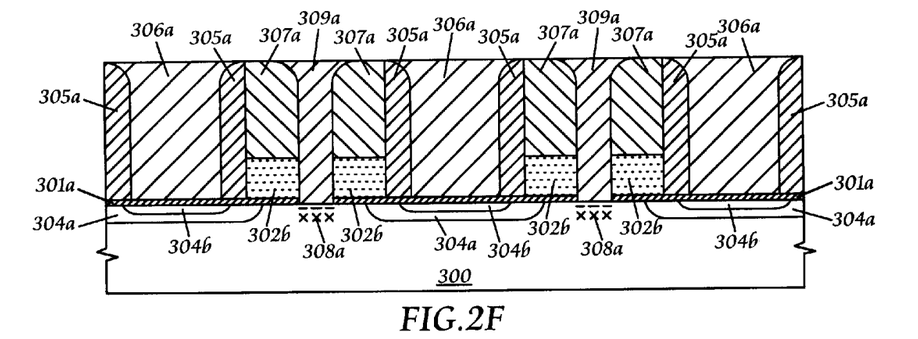

FIG. 2F shows that the tunneling dielectric layers 301 between the pair of second sidewall dielectric spacers 307a are removed by using wet etching in dilute hydrofluoric acid or anisotropic dry etching and a second planarized thick-oxide layer 309a is formed between the pair of second sidewall dielectric spacers 307a. The second planarized thick-oxide layer 309a is preferably made of silicon dioxide and is preferably deposited by LPCVD or high-temperature oxide (HTO) deposition. It should be noted that a thermal oxidation process and a nitridation process can be performed (not shown) before depositing the second planarized thick-oxide layers 309a to obtain a good interface between the semiconductor substrate 300 and the second planarized thick-oxide layer 309a.

Figure 2G:
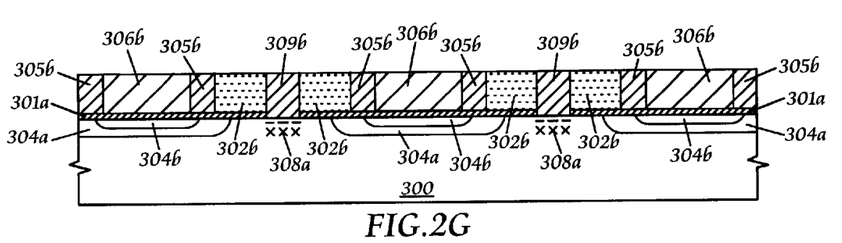

FIG. 2G shows that the pair of first sidewall dielectric spacers 305a, the first planarized thick-oxide layers 306a, and the second planarized thick-dioxide layers 309a are anisotropically etched back to a top surface level of the floating-gate layer 302b, and the pair of second sidewall dielectric spacers 307a are then removed by hot phosphoric acid or anisotropic dry etching to form a flat surface.

Figure 2H:
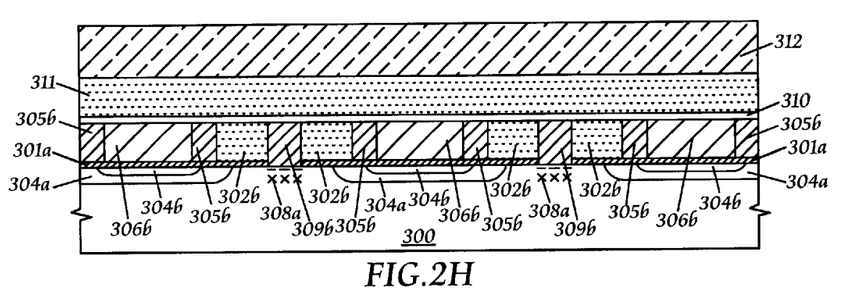

FIG. 2H shows that an intergate dielectric layer 310 is formed over the flat surface shown in FIG. 2G; a second conductive layer 311 is formed over the intergate dielectric layer 310; and a metal layer 312 is formed over the second conductive layer 311. The intergate dielectric layer 310 is preferably an oxide-nitride-oxide (ONO) layer and its equivalent silicon dioxide thickness is preferably between 100 Angstroms and 150 Angstroms. The second conductive layer 311 is preferably a doped polycrystalline silicon or doped amorphous silicon layer as deposited by LPCVD. The metal layer 312 is preferably a copper or aluminum layer over a barrier metal layer or a tungsten (W) layer over a barrier-metal layer. The barrier metal layer is preferably a titanium-nitride (TiN) or tantalum-nitride (TaN) layer.

Figure 2I:
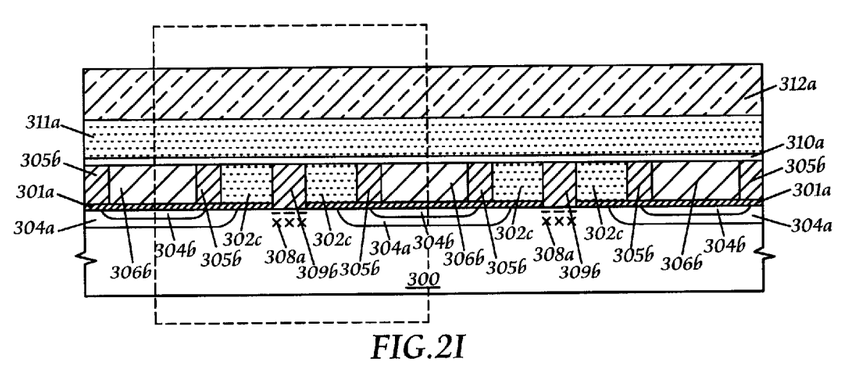

FIG. 2I shows that the metal layer 312, the second conductive layer 311, the intergate dielectric layer 310, the floating-gate layers 302b are patterned simultaneously by using a second masking photoresist step (PR2) (not shown) to form a plurality of word lines 312a/311a being formed transversely to the plurality of common-source/drain diffusion bit lines 304b/304a and the floating-gate layers 302b are etched to form a pair of isolated floating-gate islands 302c for each of the dual-bit floating-gate cells. It should be noted that an ion-implantation process (not shown) can be performed in a self-aligned manner (see FIG. 3A through FIG. 3D) by implanting a moderate dose of doing impurities across the tunneling dielectric layers 301a to form isolation implant regions 313a of the first conductivity type between nearby word lines (312a/311a) as the diffusion isolation regions. It should be emphasized that the isolation implant regions 313a can be replaced by forming shallow trenches (not shown) to form shallow trench isolation (STI) regions as marked by the isolation implant regions 313a. It is clearly seen that only two masking photoresist steps (PR1 and PR2) are required to form a dual-bit floating-gate cell as indicated by a dash square in FIG. 2I and the contactless parallel common-source/drain diffusion bit-lines flash memory array of the present invention and the cell size of each bit can be made to be equal to 2F .

Figure 3A:
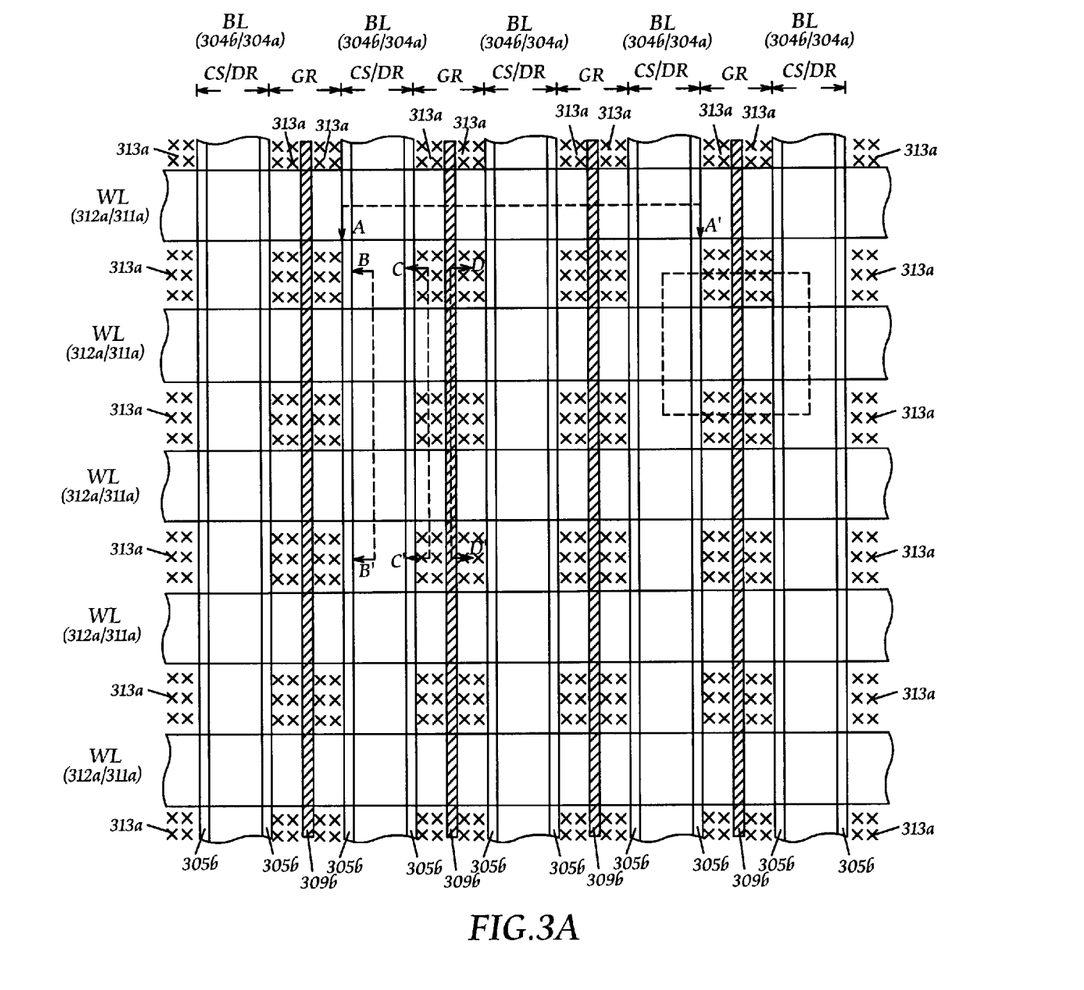
FIG. 3A shows a schematic top plan view of a contactless parallel common-source/drain diffusion bit-lines array of the present invention.
Figure 3B:
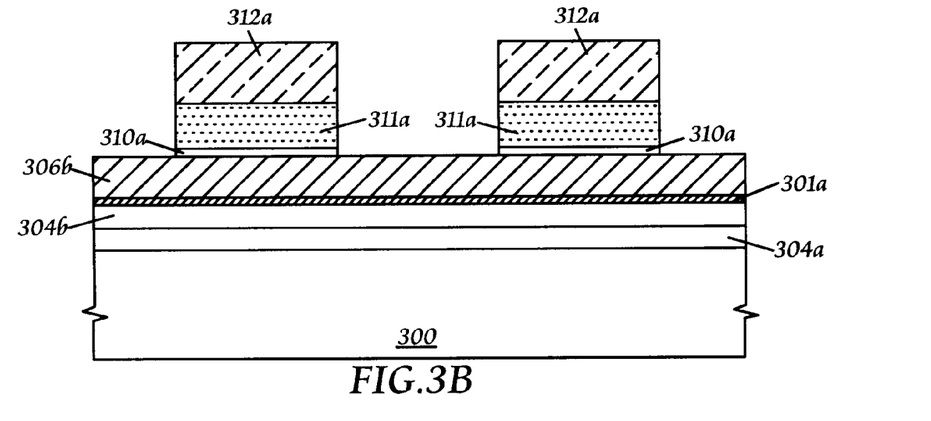
FIG. 3B through FIG. 3D show various cross-sectional views as indicated in FIG. 3A, in which a cross-sectional view along a B–B' line as indicated in FIG. 3A is shown in FIG. 3B; a cross-sectional view along a C–C' line as indicated in FIG. 3A is shown in FIG. 3C; and a cross-sectional view along a D–D' line as indicated in FIG. 3A is shown in FIG. 3D.
Figure 3C:
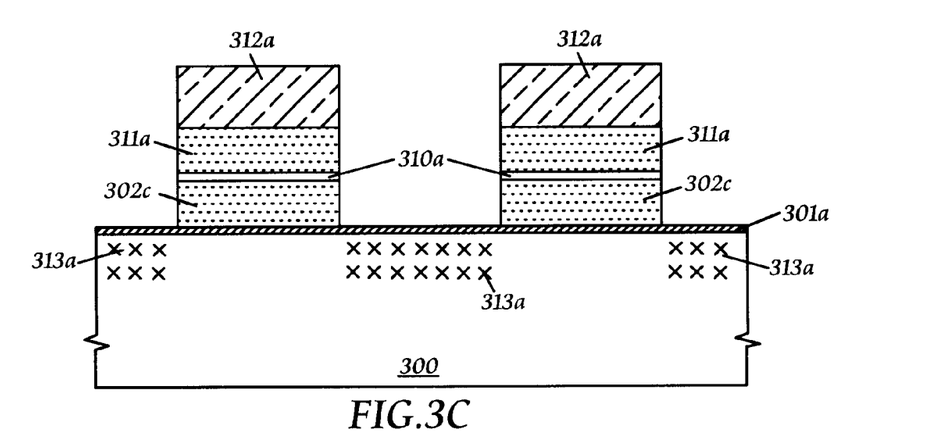
Figure 3D:
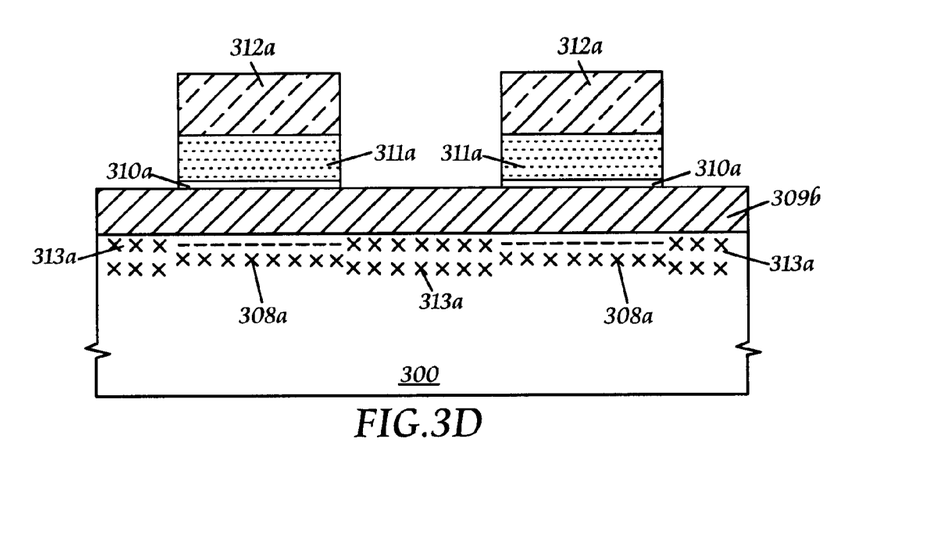

FIG. 3A shows a top plan view of the contactless parallel common-source/drain diffusion bit-lines flash memory array of the present invention, in which a cross-sectional view of the cross-sectional view along a A–A' line is shown in FIG. 2I; a cross-sectional view along a B–B' line as indicated in FIG. 3A is shown in FIG. 3B; a cross-sectional view along a C–C' line as indicated in FIG. 3A is shown in FIG. 3C; and a cross-sectional view along a D–D' line as indicated in FIG. 3A is shown in FIG. 3D.

FIG. 3A shows that a plurality of common-source/drain diffusion bit lines 304b/304a (BL's) are formed alternately in a semiconductor substrate 300; each gate region (GR) is formed between the common-source/drain regions (CS/DR);

a plurality of metal word lines 312a together with the control-gate layers 311a, the intergate dielectric layer 310a, and the floating-gates 302c are simultaneously patterned and anisotropically etched to be perpendicular to the plurality of common-source/drain diffusion bit lines 304b/304a (BL's); a plurality of paired floating-gates 302c are formed under each of the plurality of metal word lines 312a with a select-gate dielectric layer 309b being formed between the paired floating-gates 302c; and a plurality of isolation implant regions 313a are formed in a self-aligned manner between nearby metal word lines 312a and nearby common-source/drain regions (CS/DR). FIG. 3A shows that a unit cell size (UCS) of a dual-bit floating-gate cell as marked by a dash square is $4F^2$ if the common-source/drain region (CS/DR), the gate region (GR), the metal word-line width, and the isolation width are defined by the minimum feature size (F) of technology used. Therefore, the cell size of each bit is $2F^2$.

FIG. 3B shows a cross-sectional view along a B–B' line as indicated in FIG. 3A, in which the common-source/drain diffusion region 304b/304a of the second conductivity type being acted as a common source/drain diffusion bit line (BL) is formed in a surface portion of the semiconductor substrate 300; the tunneling dielectric layer 301a is formed over the common-source/drain diffusion region 304b/304a; the etched-back first planarized thick-oxide layer 306b is formed over the tunneling dielectric layer 301a; and the plurality of metal word lines 312a together with the control-gate layer 311a and the intergate dielectric layer 310a are simultaneously patterned and anisotropically etched by a second masking photoresist step (PR2) (not shown).

FIG. 3C shows a cross-sectional view along a C–C' line as indicated in FIG. 3A, in which the plurality of metal word lines 312a together with the control-gate layer 311a, the intergate dielectric layer 310a, and the floating-gates 302c are simultaneously patterned and anisotropically etched by the second masking photoresist step (PR2) as described; and a plurality of isolation implant regions 313a are formed in the semiconductor substrate 300 between nearby metal word lines 312a.

FIG. 3D shows a cross-sectional view along a D–D' line shown in FIG. 3A, in which the plurality of metal word lines 312a together with the control-gate layers 311a and the intergate dielectric layers 310a are simultaneously patterned and anisotropically etched by the second masking photoresist step (PR2) as described and are formed over the select-gate dielectric layer 309b; the implant regions 308a are formed between the pair floating-gates 302c and under each of the plurality of word lines 312a/311a; and the isolation implant regions 313a are formed between nearby metal word lines 312a/311a and nearby common-source/drain regions (CS/DR). The implant region 308a may comprise a shallow implant region as indicated by a dash line for threshold-voltage adjustment and a deep implant region as indicated by cross symbols for forming a punch-through stop. It should be emphasized that the isolation implant region 313a being formed under the select-gate dielectric layer 309b is mainly due to the doping encroachment of doping impurities being implanted between the word lines 312a/311a.

Figure 3E:
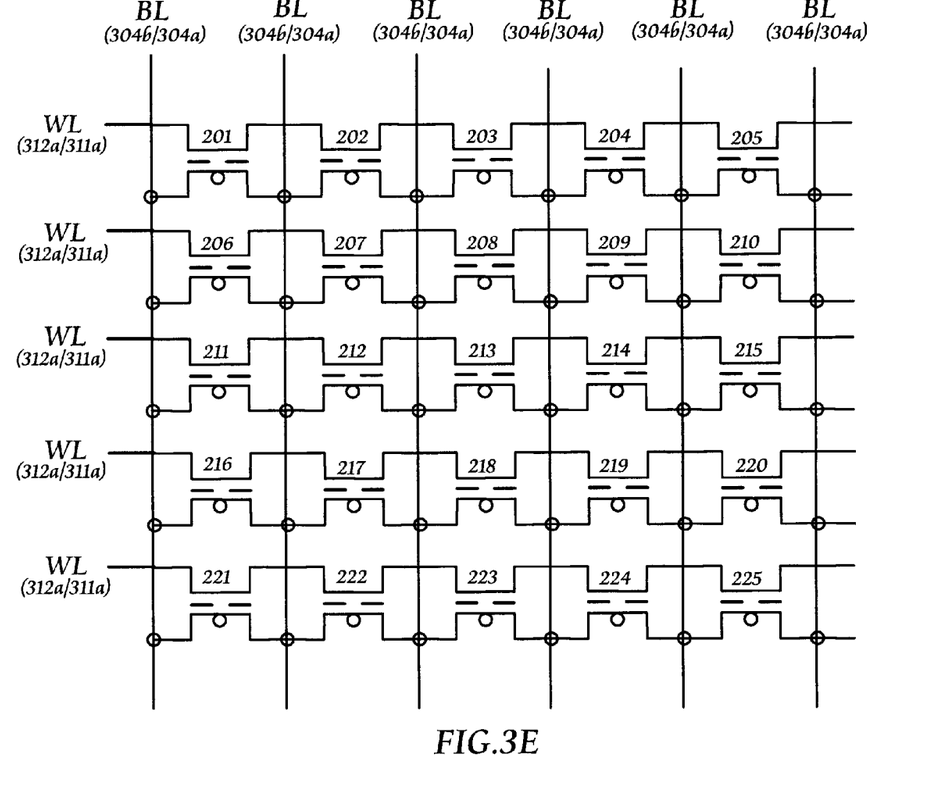
FIG. 3E shows a schematic circuit representation of a contactless parallel common-source/drain diffusion bit-lines array of the present invention.

FIG. 3E shows a schematic circuit representation of the parallel common-source/drain diffusion bit lines array of the present invention, in which the plurality of common-source/drain diffusion bit lines 304b/304a are formed alternately in surface portions of the semiconductor substrate 300; a plurality of dual-bit floating-gate cells (201–225) are formed alternately between the plurality of common-source/drain diffusion bit lines 304b/304a; and a plurality of metal word lines (WL's) are formed transversely to the plurality of common-source/drain diffusion bit lines 304b/304a (BL's). Each of the plurality of dual-bit floating-gate cells (201–225) comprises a pair of floating-gate transistors and a select-gate transistor being formed between the pair of floating-gate transistors and a circle is formed under the select-gate region of each of the dual-bit floating-gate cells to indicate the implant region 308a. It is clearly seen that the select-gate transistor in each of the dual-bit floating-gate cells can be used to eliminate the over-erase problem in the parallel common-source/drain diffusion bit-lines array of the present invention.

Figure 4A:
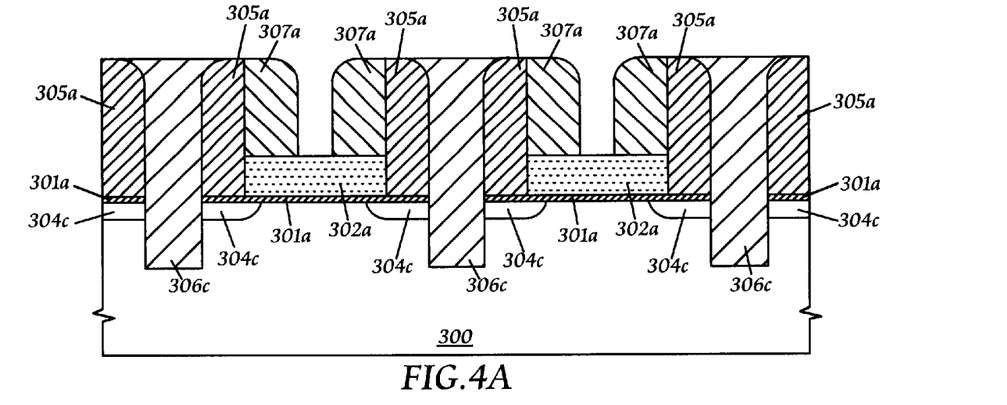
FIG. 4A through FIG. 4C show simplified process steps after FIG. 2C and their cross-sectional views for forming a dual-bit floating-gate cell structure and its contactless parallel isolated source/drain diffusion bit-lines array of the present invention.
Figure 4B:
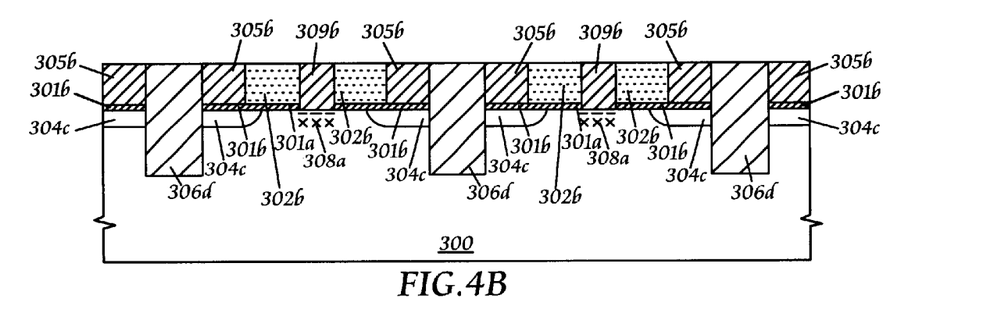
Figure 4C:
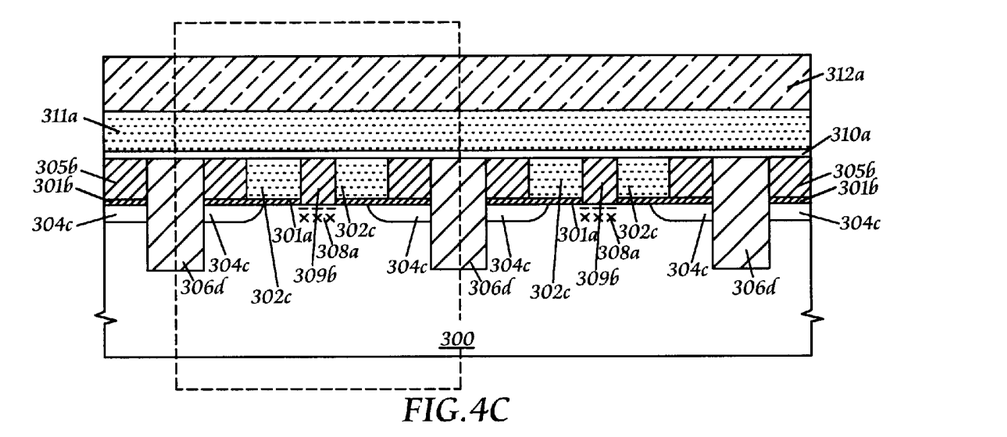

Referring now to FIG. 4A through FIG. 4C, there are shown simplified process steps after FIG. 2C and their cross-sectional views for forming a dual-bit floating-gate cell and its contactless parallel isolated source/drain diffusion bit-lines array of the present invention.

FIG. 4A shows that the tunneling dielectric layer 301 between the pair of first sidewall dielectric spacers 305a in each of the common-source/drain regions (CS/DR) is removed by anisotropic dry etching and the semiconductor substrate 300 between the pair of first sidewall dielectric spacers 305a are anisotropically etched to form shallow trenches; and subsequently, a first planarized thick-oxide layer 306c is formed to fill a gap between the pair of first sidewall dielectric spacers 305a. FIG. 4A also shows that the patterned first masking dielectric layers 303a are selectively removed by using hot phosphoric acid or anisotropic dry etching and a pair of second sidewall dielectric spacers 307a are then formed over sidewalls of each of the removed patterned first masking dielectric layers 303a. The first planarized thick-oxide layer 306c is preferably made of silicon dioxide, P-glass, or BP-glass as deposited by LPCVD, HDPCVD, or PECVD. The second sidewall dielectric spacer 307a is preferably made of silicon nitride as deposited by LPCVD. It should be noted that a liner oxide layer (not shown) can be formed over each of the trench surface before forming the first planarized thick-oxide layers 306c. Moreover, it is clearly seen that each of the common-source/drain diffusion regions 304a (CS/DR) shown in FIG. 2C is divided into two isolated source/drain diffusion regions 304c by the first planarized thick-oxide layer 306c in each of the shallow trenches.

Following the same process steps shown in FIG. 2E through FIG. 2G, FIG. 4A can be processed to obtain FIG. 4B, in which the first planarized thick-oxide layer 306c in each of the shallow trenches is etched back to form an etched-back first planarized thick-oxide layer 306d.

FIG. 4C shows that an intergate dielectric layer 310, a second conductive layer 311, and a metal layer 312 are sequentially formed over a flat surface shown in FIG. 4B and are simultaneously patterned and etched by a second masking photoresist step PR2 as described for FIG. 2I to form a plurality of word lines 312a/311a being perpendicular to the isolated source/drain diffusion bit-lines 304c. Similarly, the semiconductor substrate 300 between the plurality of word lines 312a/311a and the plurality of common-source/drain regions (CS/DR) are implanted to form the isolation implant regions 313a as described for FIG. 2I. The dash square as masked in FIG. 4C indicates a dual-bit floating-gate cell of the present invention. It is also clearly seen that the limit cell size of the dual-bit floating-gate cell is $4F^2$ and the limit cell size of each bit is $2F^2$.

Figure 5A:
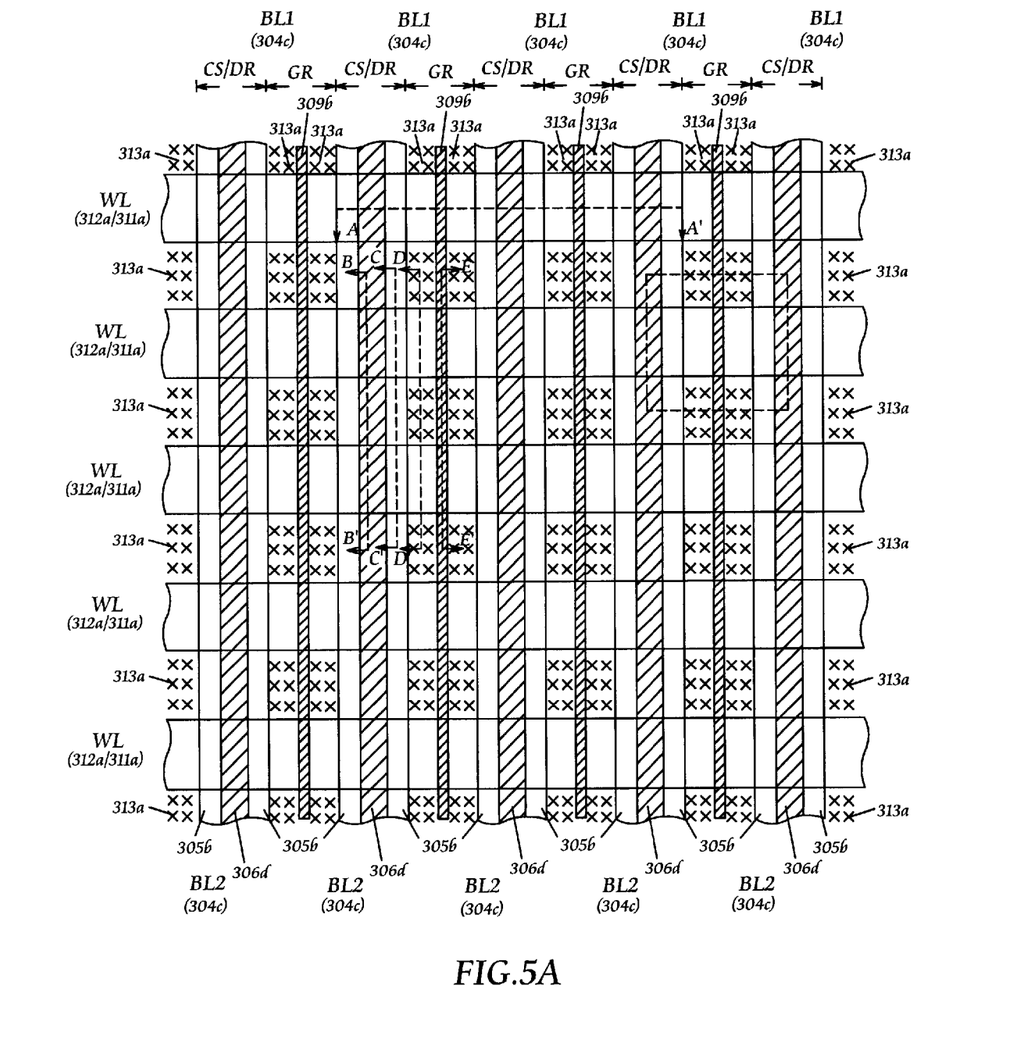
FIG. 5A shows a schematic top plan view of the contactless parallel isolated source/drain diffusion bit-lines array of the present invention.

FIG. 5A shows a schematic top plan view of the contactless parallel isolated source/drain diffusion bit-lines array of the present invention, in which a cross-sectional view along a A–A' line as indicated in FIG. 5A is shown in FIG. 4C. It is clearly seen from FIG. 5A that a plurality of isolated source/drain diffusion bit lines (BL1's, BL2's) 304c are formed in parallel and are perpendicular to a plurality of word lines (WL's) 312a/311a. Each of the common-source/drain regions (CS/DR) comprises an etched-back first planarized thick-oxide layer 306d being formed over a shallow trench and a pair of isolated source/drain diffusion regions (BL1, BL2). The isolation implant region 313a is formed between nearby word lines 312a/311a (WL) and between nearby etched-back first sidewall dielectric spacers 305b. The unit cell size (UCS) of a dual-bit floating-gate cell as marked by a dash square can be made to be equal to $4F^2$ and the unit cell size of each bit is $2F^2$.

Figure 5B:
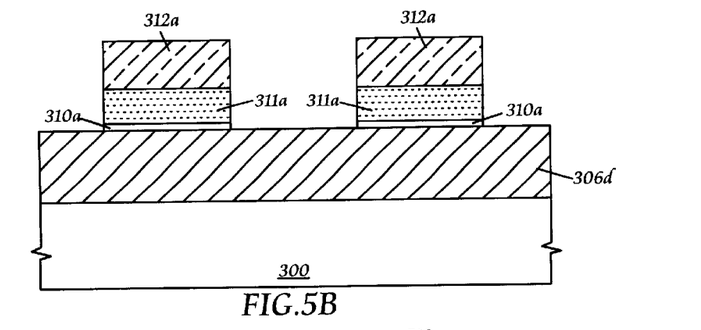
FIG. 5B through FIG. 5E show various cross-sectional views as indicated in FIG. 5A, in which a cross-sectional view along a B–B' line as indicated in FIG. 5A is shown in FIG. 5B; a cross-sectional view along a C–C' line as indicated in FIG. 5A is shown in FIG. 5C; a cross-sectional view along a D–D' line as indicated in FIG. 5A is shown in FIG. 5D; and a cross-sectional view along a E–E' line as indicated in FIG. 5A is shown in FIG. 5E.

FIG. 5B shows a cross-sectional view along a B–B' line as indicated in FIG. 5A, in which the etched-back first planarized thick-oxide layer 306d is formed over the shallow trench and the plurality of word lines 312a/311a together with the intergate dielectric layer 310a are formed over the etched-back first planarized thick-oxide layer 306d.

Figure 5C:
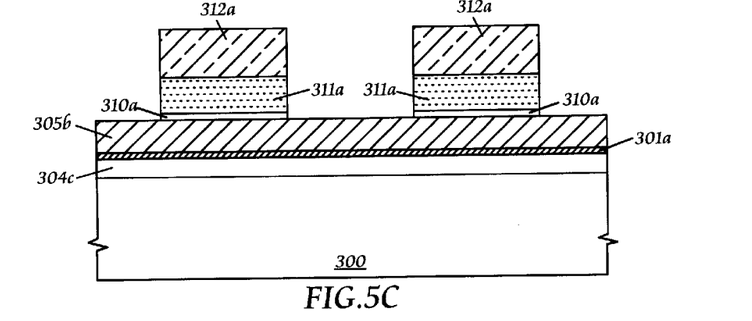

FIG. 5C shows a cross-sectional view along a C–C' line as indicated in FIG. 5A, in which an isolated source/drain diffusion region 304c is formed in a surface portion of the semiconductor substrate 300; an etched-back first sidewall dielectric spacer 305b over the tunneling dielectric layer 301b is formed over the isolated source/drain diffusion region 304c; and the plurality of word lines 312a/311a together with the intergate dielectric layer 310a are formed over the etched-back first sidewall dielectric spacers 305b.

Figure 5D:
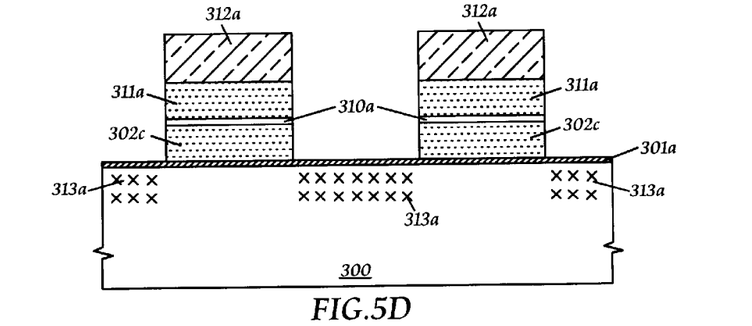

FIG. 5D shows a cross-sectional view along a D-D' line as indicated in FIG. 5A, in which a plurality of word lines 312a/311a, the intergate dielectric layers 310a, and the paired floating-gates 302c are simultaneously patterned to form a plurality of gate stacks over the tunneling dielectric layer 301b and the isolation implant regions 313a are formed between nearby gate stacks.

Figure 5E:
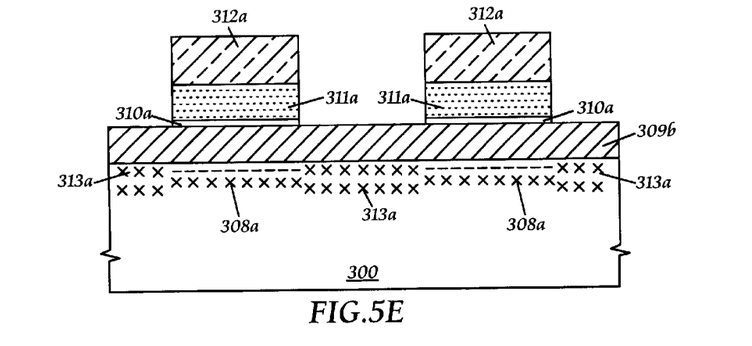

FIG. 5E shows a cross-sectional view along a E–E' line as indicated in FIG. 5A, in which a plurality of word lines 312a/311a together the intergate dielectric layers 310a are formed over the select-gate dielectric layer 309b; the implant region 308a is formed under each of the plurality of word lines 312a/311a; and the isolation implant region 313a is formed between nearby word lines 312a/311a due to implant doping encroachment. The implant region 308a may comprise a shallow implant region as indicated by a dash line for threshold-voltage adjustment and a deep implant region as indicated by cross symbols for forming a punch-through stop.

Figure 5F:
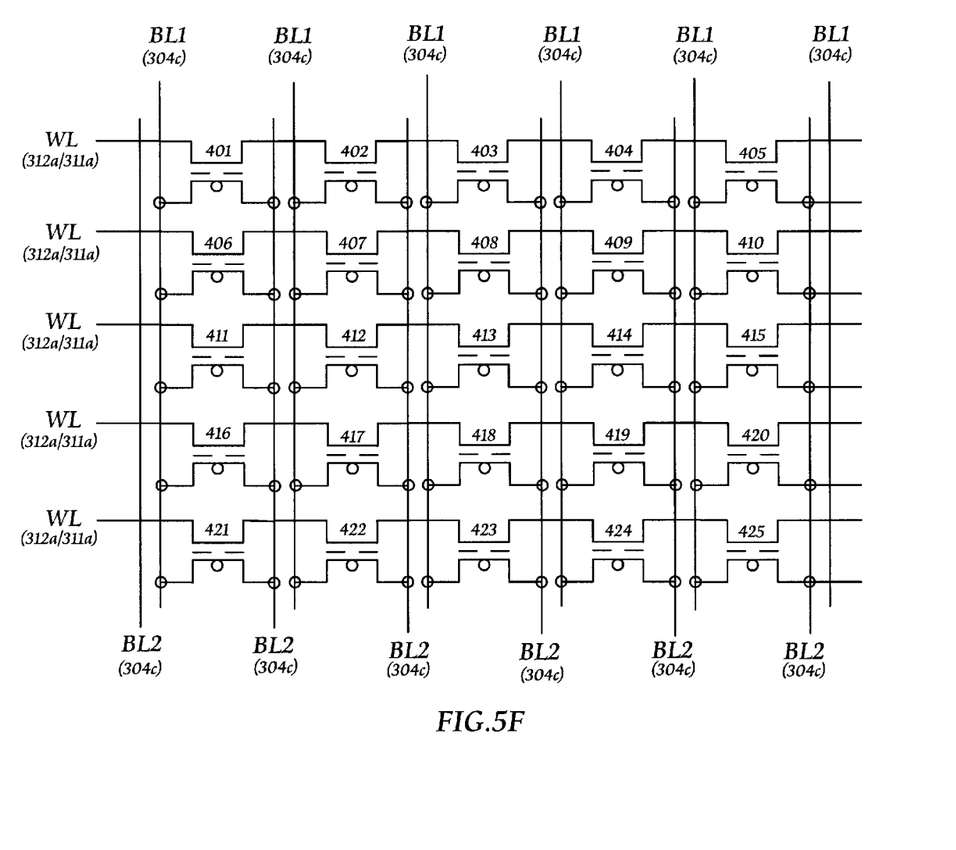
FIG. 5F shows a schematic circuit representation of a contactless parallel isolated source/drain diffusion bit-lines array of the present invention.

FIG. 5F shows a schematic circuit representation of the contactless parallel isolated source/drain diffusion bit-lines array of the present invention, in which a plurality of dual-bit floating-gate cells in each column are formed between the pair of isolated source/drain diffusion bit lines (BL1 and BL2) and the plurality of word lines 312a/311a are formed transversely to the plurality of isolated source/drain diffusion bit lines 304d (BL1's and BL2's). It is clearly seen that each bit in a dual-bit floating-gate cell can be programmed and erased independently and each bit can be programmed by Fowler-Nordheim tunneling of electrons from the isolated source/drain diffusion region 304c into the floating-gate 302c through the tunneling dielectric layer 301b.

Accordingly, the dual-bit floating-gate cell structure and its contactless flash memory arrays of the present invention offer the following features and advantages:

(a) The dual-bit floating-gate cell structure of the present invention can offer a unit cell size of $4F^2$ with a cell size of each bit equal to $2F^2$.

(b) The dual-bit floating-gate cell structure of the present invention offers a self-aligned select-gate region with a high threshold voltage to eliminate the over-erase problem and an efficient punch-through stop for further scaling the cell size.

(c) The dual-bit floating-gate cell structure and its contactless flash memory arrays of the present invention can be fabricated in a self-aligned manner by using two masking photoresist steps.

(d) The contactless flash memory arrays of the present invention offer a metal word line to largely reduce each word-line resistance.

(e) The contactless flash memory arrays of the present invention offer smaller parasitic capacitance between each word line and the buried diffusion bit lines.

(f) The contactless parallel isolated source/drain diffusion bit-lines flash memory array of the present invention offers highly flexible programming and erasing operations.

While the present invention has been particularly shown and described with a reference to the present examples and embodiments as considered as illustrative and not restrictive. Moreover, the present invention is not to be limited to the details given herein, it will be understood by those skilled in the art that various changes in form and details may be made without departure from the true spirit and scope of the present invention.

What is claimed is:

1. A dual-bit floating-gate flash cell structure, comprising:

a semiconductor substrate of a first conductivity type;

a cell region being formed on said semiconductor substrate, wherein said cell region comprises a gate region being formed between a common-source region and a common-drain region;

said gate region comprising a pair of floating-gates being defined by a pair of second sidewall dielectric spacers and a select-gate dielectric layer being formed between said pair of floating-gates, wherein a first portion of a tunneling dielectric layer is formed under each of said pair of floating-gates and an implant region of said first conductivity type is formed in a surface portion of said semiconductor substrate under said select-gate dielectric layer;

said common-source/drain region comprising a common-source/drain diffusion region of said second conductivity type being formed in a surface portion of said semiconductor substrate, a pair of etched-back first sidewall dielectric spacers being formed over a second portion of the tunneling dielectric layer, and an etched-back first planarized thick-oxide layer being formed between said pair of etched-back first sidewall dielectric spacers;

a word line over an intergate dielectric layer being formed over said pair of floating-gates and said select-gate dielectric layer in said gate region and over said etched back first planarized thick-oxide layer and said pair of etched-back first sidewall dielectric spacers in each of said common-source/drain regions; and two cell isolation regions being separately formed outside of said word line and between said common-source/drain regions.

2. The dual-bit floating-gate flash cell structure according to claim 1, wherein said word line comprises a metal layer over a doped polycrystalline silicon or doped amorphous silicon layer and said intergate dielectric layer comprises an oxide-nitride-oxide (ONO) layer.

3. The dual-bit floating-gate flash cell structure according to claim 1, wherein said cell isolation region comprises an isolation implant region of said first conductivity type being formed in a surface portion of said semiconductor substrate.

4. The dual-bit floating-gate flash cell structure according to claim 1, wherein said cell isolation region comprises a shallow trench isolation (STI) region being formed in a surface portion of said semiconductor substrate.

5. The dual-bit floating-gate flash cell structure according to claim 1, wherein a shallow heavily-doped common-source/drain region of said second conductivity type being formed within each of said common-source/drain diffusion regions is formed by implanting doping impurities across said tunneling dielectric layer between said pair of first sidewall dielectric spacers.

6. The dual-bit floating-gate flash cell structure according to claim 1, wherein a shallow trench is formed in a surface portion of said semiconductor substrate between said pair of etched-back first sidewall dielectric spacers to divide each of said common-source/drain diffusion regions into two isolated source/drain diffusion regions and said etched-back first planarized thick-oxide layer is formed over said shallow trench.

7. The dual-bit floating-gate flash cell structure according to claim 1, wherein said implant region under said select-gate dielectric layer comprises a shallow implant region for threshold-voltage adjustment and a deep implant region for forming a punch-through stop.

8. A contactless flash memory array, comprising:

a semiconductor substrate of a first conductivity type;

a plurality of gate regions being alternately formed on said semiconductor substrate by using a first masking photoresist step, wherein each of the plurality of gate regions is formed between common-source/drain regions;

each of said common-source/drain regions comprising a common-source/drain diffusion region of said second conductivity type being formed in a surface portion of said semiconductor substrate to act as a buried diffusion bit line, a pair of etched-back first sidewall dielectric spacers being separately formed over a second portion of a tunneling dielectric layer, a shallow heavily-doped common-source/drain diffusion region of said second conductivity type being formed within said common-source/drain diffusion region by implanting doping impurities across said tunneling dielectric layer between a pair of first sidewall dielectric spacers, and an etched/back first planarized thick-oxide layer being formed between said pair of etched-back first sidewall dielectric spacers;

each of the plurality of gate regions comprising a plurality of paired floating-gates being defined by a pair of second sidewall dielectric spacers and a select-gate dielectric layer being at least formed over said semiconductor substrate between the plurality of paired floating-gates, wherein an implant region of said first conductivity type is formed in a surface portion of said semiconductor substrate under said select-gate dielectric layer and a first portion of said tunneling dielectric layer being at least formed under each of the plurality of paired floating-gates;

a plurality of word lines over a plurality of intergate dielectric layers being formed transversely to said common-source/drain regions and over the plurality of paired floating-gates and said select-gate dielectric layers in each of the plurality of gate regions and over a portion of the plurality of etched-back first sidewall dielectric spacers and said etched-back first planarized thick-oxide layers in each of said common-source/drain regions, wherein the plurality of word lines, the plurality of intergate dielectric layers and the plurality of paired floating-gates are simultaneously patterned and etched by a second masking photoresist step; and a plurality of cell isolation regions being formed in surface portions of said semiconductor substrate outside of the plurality of word lines and between said common-source/drain regions.

9. The contactless flash memory array according to claim 8, wherein said implant region under said select-gate dielectric layer comprises a shallow implant region for threshold-voltage adjustment and a deep implant region for forming a punch-through stop.

10. The contactless flash memory array according to claim 8, wherein each of the plurality of word lines comprises a metal layer over a barrier metal layer being formed over a doped polycrystalline silicon and doped amorphous silicon layer and said intergate dielectric layer comprises an oxide-nitride-oxide (ONO) layer.

11. The contactless flash memory array according to claim 8, wherein said cell isolation region comprises an isolation implant region of said first conductivity type being formed in a surface portion of said semiconductor substrate.

12. The contactless flash memory array according to claim 8, wherein said cell isolation region comprises a shallow trench isolation (STI) region being formed in a surface portion of said semiconductor substrate.

13. A contactless flash memory array, comprising:

a semiconductor substrate of a first conductivity type;

a plurality of gate regions being alternately formed on said semiconductor substrate by using a first masking photoresist step, wherein each of the plurality of gate regions is formed between common source/drain regions;

each of said common-source/drain regions comprising a pair of isolated source/drain diffusion regions being defined by a pair of first sidewall dielectric spacers, a shallow trench being formed in a surface portion of said semiconductor substrate between said pair of first sidewall dielectric spacers, a pair of etched-back first sidewall dielectric spacers being formed over a second portion of a tunneling-dielectric layer, and an etched-back first planarized thick-oxide layer being formed between said pair of etched-back first sidewall dielectric spacers and over said shallow trench;

each of the plurality of gate regions comprising a plurality of paired floating-gates being defined by a pair of second sidewall dielectric spacers and a select-gate dielectric layer being at least formed over said semiconductor substrate between the plurality of paired floating-gates, wherein an implant region of said first conductivity type is formed in a surface portion of said semiconductor substrate under said select-gate dielectric layer and a first portion of said tunneling dielectric layer being at least formed under the plurality of paired floating-gates;

a plurality of word lines over a plurality of intergate dielectric layers being formed transversely to said common-source/drain regions and over the plurality of paired floating-gates and said select-gate dielectric layers in each of the plurality of gate regions and over the plurality of etched-back first sidewall dielectric spacers and said etched-back first planarized thick-oxide layers in each of said common-source/drain regions, wherein the plurality of word lines, the plurality of intergate dielectric layers and the plurality of paired floating-gates are simultaneously patterned and etched by a second masking photoresist step; and a plurality of cell isolation regions being formed in surface portions of said semiconductor substrate outside of the plurality of word lines and between said common-source/drain regions.

14. The contactless flash memory array according to claim 13, wherein said implant region under said select-gate dielectric layer comprises a shallow implant region for threshold-voltage adjustment and a deep implant region for forming a punch-through stop.

15. The contactless flash memory array according to claim 13, wherein each of said pair of isolated source/drain diffusion regions comprises a shallow heavily-doped diffusion region being formed over a lightly-doped diffusion region.

16. The contactless flash memory array according to claim 13, wherein each of the plurality of word lines comprises a metal layer over a barrier metal layer being formed over a doped polycrystalline silicon or doped amorphous silicon layer.

17. The contactless flash memory array according to claim 13, wherein said cell isolation region comprises an isolation implant region of said first conductivity type being formed in a surface portion of said semiconductor substrate.

18. The contactless flash memory array according to claim 13, wherein said cell isolation region comprises a shallow trench isolation (STI) region being formed in a surface portion of said semiconductor substrate.

19. The contactless flash memory array according to claim 13, wherein said intergate dielectric layer comprises an oxide-nitride-oxide (ONO) layer and said tunneling dielectric layer comprises a thermal oxide layer or a nitrided thermal oxide layer.

20. The contactless flash memory array according to claim 13, wherein said select-gate dielectric layer comprises a silicon dioxide layer or a nitrided silicon dioxide layer.

* * * * *